United States Patent [19]

Paulinski

[11] Patent Number: 4,496,903
[45] Date of Patent: Jan. 29, 1985

[54] CIRCUIT BOARD TEST FIXTURE

[75] Inventor: Ronald A. Paulinski, Goleta, Calif.

[73] Assignee: Burroughs Corporation, Detroit, Mich.

[21] Appl. No.: 262,638

[22] Filed: May 11, 1981

[51] Int. Cl.³ .............................................. G01R 31/02
[52] U.S. Cl. ............................ 324/158 F; 324/73 PC; 324/158 P
[58] Field of Search ............... 324/158 F, 158 P, 72.5, 324/73 PC; 339/117 P

[56] References Cited

U.S. PATENT DOCUMENTS 4,352,061 9/1982 Matrone ........................... 324/158 F Primary Examiner—Ernest F. Karlsen
Attorney, Agent, or Firm—Nathan Cass; Kevin R. Peterson

[57] ABSTRACT

A test fixture having a planar array of spring-loaded contact probes of sufficient number and arrangement to accommodate circuit boards having different patterns of test points. A personalizing board is provided for each different test point pattern and contains partially drilled holes corresponding to probes which are not required for the test point pattern of its corresponding circuit board and completely drilled holes corresponding to probes which are required by the test point pattern. In operation, a personalizing board is mechanically forced against the array of probes so as to cause the probes in the partially drilled holes which are not needed to be depressed, while leaving the required probes in the completely drilled holes undepressed. The vacuum which is used to force the circuit board against the probes thus need depress only the required probes.

9 Claims, 6 Drawing Figures

CIRCUIT BOARD TEST FIXTURE

BACKGROUND OF THE INVENTION

The present invention relates generally to improved methods and apparatus for testing electrical circuit cards or boards having different patterns of test points. An electrical circuit board or card may typically contain integrated circuits, resistors, printed circuits, etc.

As exemplified by U.S. Pat. Nos. 3,016,489; 3,757,219; 3,654,585 and 4,164,704, various circuit board testing apparatus are known whereby an array of contact probes (connected to test apparatus) are urged into contact with the conductive test points of a circuit board which is to be tested.

One advantageous approach has been to employ a test fixture containing an array of spring-loaded contacts which are forced into contact with the test points of a circuit board by creating a vacuum between the board and fixture. The use of a vacuum has the advantage of creating a uniform distribution of force across the board. In order to provide for testing boards having different patterns of test points, the test fixture is typically provided with sufficient spring-loaded contact probes to accommodate a number of different test point patterns. A personalizing board or the like is then employed for each different type of circuit board to be tested to select the desired probe pattern which is to be used for that circuit board. However, since each spring-loaded probe is typically loaded with a 4 ounce to 8 ounce spring, and since the vacuum can provide a force on the contact probes of no greater than ambient pressure (about 14 pounds per square inch), the number of spring-loaded probes which can be provided per square inch is limited, which in turn limits the number of different types of boards which can be tested by a vacuum-type test fixture.

Known vacuum-type circuit board test fixtures have attempted to circumvent the above described limitation on the number of spring-loaded contact probes that can be provided by providing different types of contact probe arrays, or by providing for removing probes that are not needed, or by providing expensive personalizing boards that obviate the need for the vacuum to depress unused probes. However, these approaches are cumbersome and/or expensive.

SUMMARY OF THE INVENTION

In accordance with the present invention, an expeditious, relatively simple and inexpensive solution is provided which permits the number of spring-loaded contact probes which may be provided in a test fixture to be increased significantly beyond what would otherwise be possible when a vacuum is used to depress the probes.

In a particular preferred embodiment of the invention, relatively simple, inexpensive and easily interchangeable personalizing boards (one for each different circuit board test point pattern which is to be tested) are provided for use in a test fixture having an array of spring-loaded contact probes and vacuum producing apparatus. These personalizing boards may typically be made of fiberglass or the like, each containing a particular array of completely drilled and partially drilled holes of appropriate diameter for receiving the spring-loaded contact probes. The locations of these completely drilled and partially drilled holes are chosen for each personalizing board so that those spring-loaded probes which are not required are received by the partially drilled holes (and thus blocked thereby), while those spring-loaded probes which are required to make contact with the test points of the corresponding circuit board are received by the completely drilled holes, and may thus phase therethrough to be forced into contact with the circuit board's test points when vacuum is applied.

Prior to activation of the vacuum, the personalizing board is mechanically forced against the probes so as to cause the blocked portions of the partially drilled holes to depress the probes which are not to be used, while, on the other hand, leaving the selected probes in the completely drilled holes undisturbed so as to be ready to be urged into contact with the circuit board's test points when the vacuum is applied. Since the unused spring-loaded probes are thus mechanically depressed prior to the vacuum being applied, the vacuum is relieved of this burden. Accordingly, only those particular spring-loaded probes which are required for each circuit board to be tested need be depressed by the vacuum, thereby permitting the number of spring-loaded probes which may be provided in a vacuum-type circuit board test fixture to be very significantly increased, which in turn significantly increases the number of different circuit boards which may be tested thereby.

The specific nature of the invention as well as other features, advantages and uses thereof will become apparent from the following description of a preferred embodiment taken in conjunction with the accompanying drawings.

DETAILED DESCRIPTION

Like characters refer to like elements throughout the figures of the drawings. Also, certain vertical dimensions are exaggerated for greater clarity.

Initially, it is to be understood that the ultimate purpose of a circuit board test fixture of the type to which the present invention is directed is to provide for the reliable electrical connection of selected ones of an array of spring-loaded contact probes to corresponding test points on a circuit board. The basic manner in which this is accomplished for a particular preferred embodiment of the invention will now be made clear with reference to FIGS. 1-4.

Figure 1:
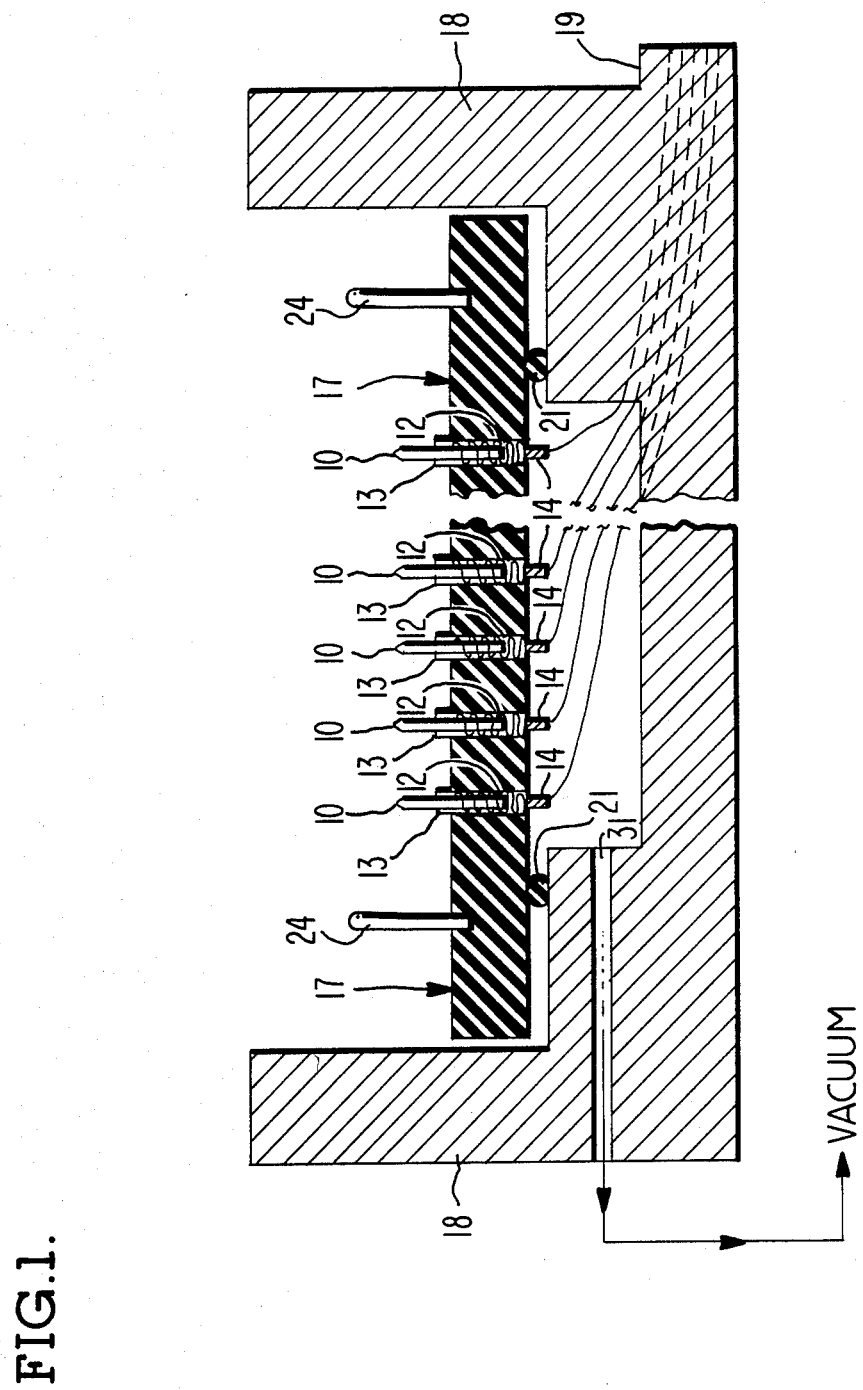
FIGS. 1-4 are cross-sectional views illustrating various steps in the use of a preferred embodiment of a test fixture in accordance with the invention.

FIG. 1 illustrates the basic structure of a test fixture in accordance with the invention wherein an array of spring-loaded probes 10 are mounted in a supporting board 17 of insulative material in a conventional manner. The supporting board 17 is in turn mounted in a fixture supporting structure 18. Although only a relatively small number of probes 10 are illustrated for greater clarity, it will be understood that many more are typically provided.

Each contact probe 10 typically comprises a socket 11 mounted in the board 10 and having an internal spring 12 which cooperates with a contact pin 13 inserted in the socket 11 in a conventional manner. The spring 12 normally maintains the contact pin 13 in a fully extended upward position while permitting the pin 13 to be depressed downwardly into the socket 18 against the spring 12 in response to applied pressure, thereby providing a resilient contact probe. An electrical lead 16 is connected to a protruding end portion 14 of each socket 11 and extends to an appropriate terminal 19 which permits convenient connection to test equipment (not shown) for testing the circuit board 15. Gasket material 21 is also included around the edges of the supporting board for providing a seal when vacuum is applied via an opening 31.

Figure 2:
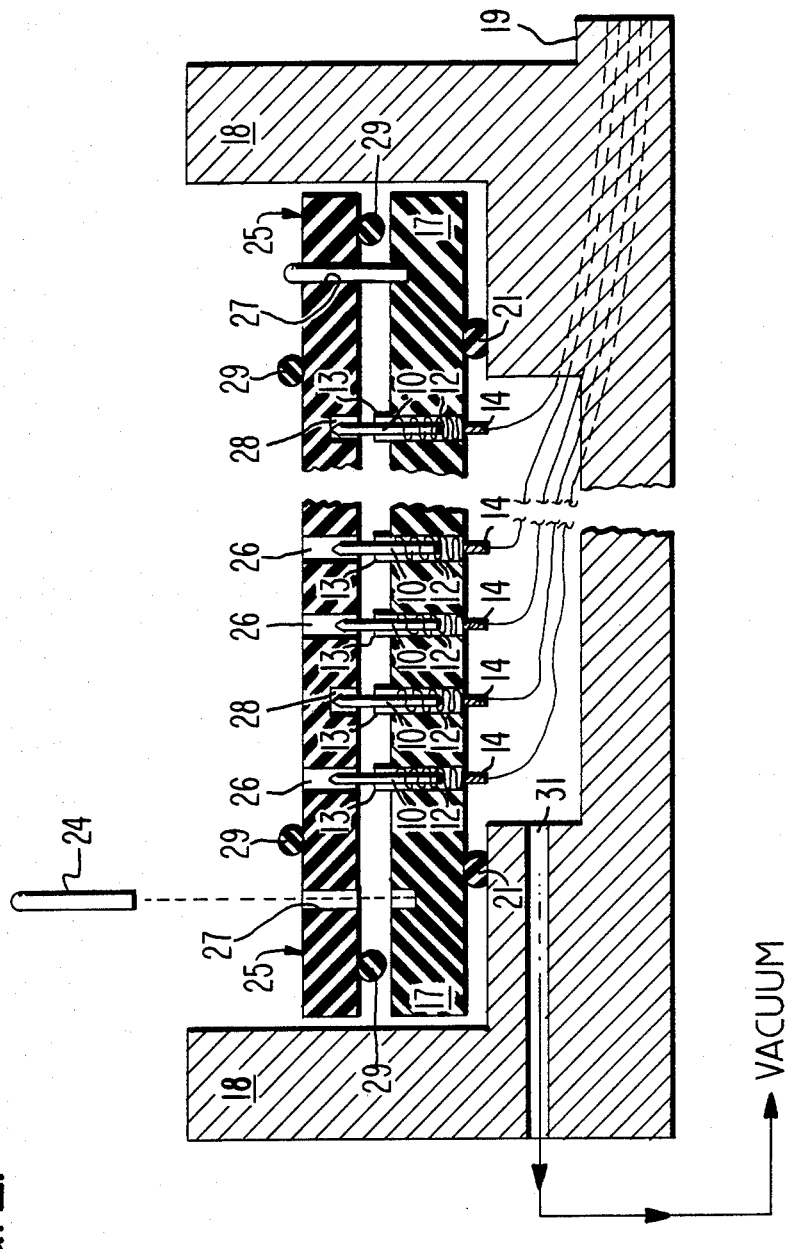
Figure 5:
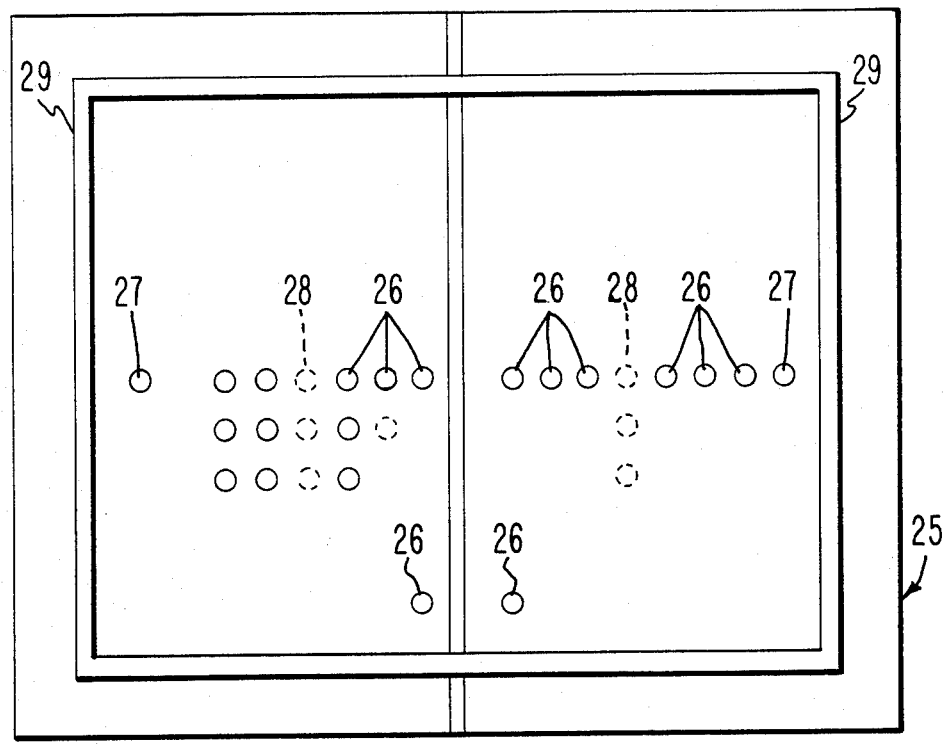
FIG. 5 is a plan view further illustrating the personalizing board employed in FIGS. 2-4.

Referring next to FIG. 2, it will be understood that the next step in testing a circuit board using a test fixture in accordance with the invention is to place a personalizing board 25 over the array test probes 10 in the test fixture using guide pins 24 and guide holes 27 for alignment purposes. A plan view of a typical personalizing board 25 is illustrated in FIG. 5. This personalizing board 25 may typically be made of fiberglass and comprises an array of completely drilled holes 26 and partially drilled holes 28 corresponding to the pattern of test points of the circuit board to be tested. More particularly, the locations of the completely drilled holes 26 are chosen so as to be in alignment with those probes 10 which are to be used for contacting test points on the circuit board to be tested, while the locations of the partially drilled holes 28 are chosen so as to be in alignment with those probes 10 which are not to be used with the circuit board to be tested. The personalizing board 25 also includes gasket material 29 around its periphery on its upper and lower sides for providing a seal when vacuum is provided.

Figure 3:
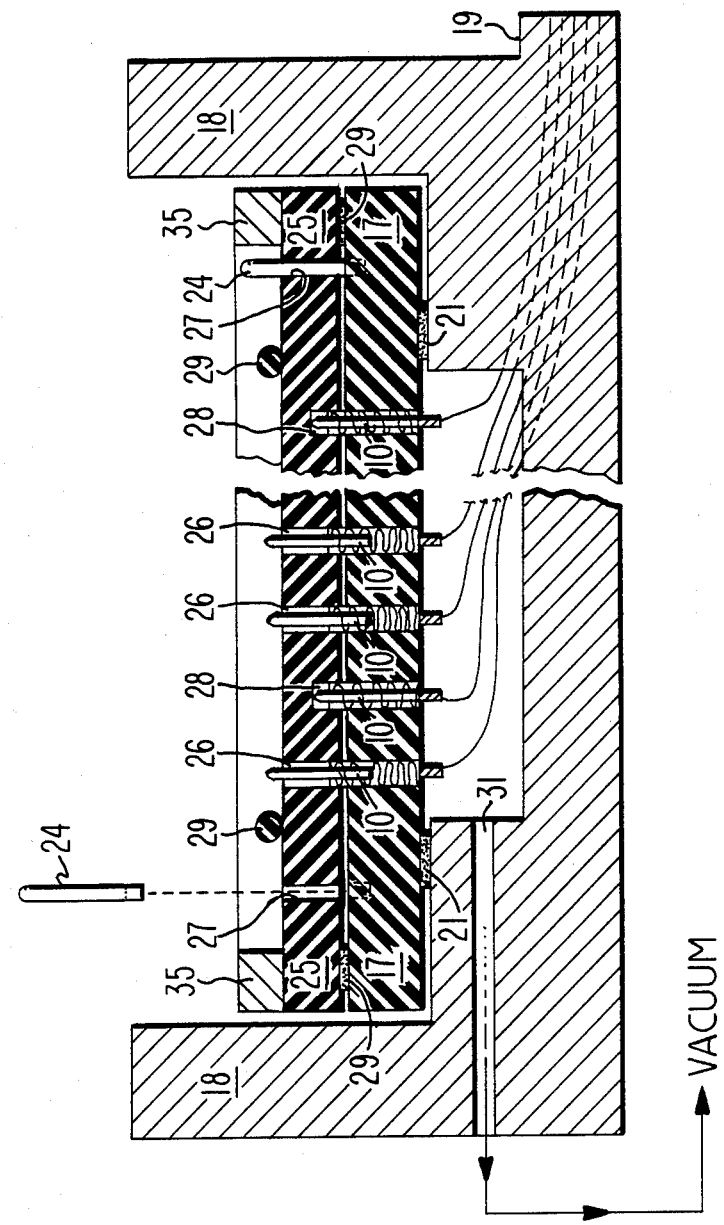
Figure 6:
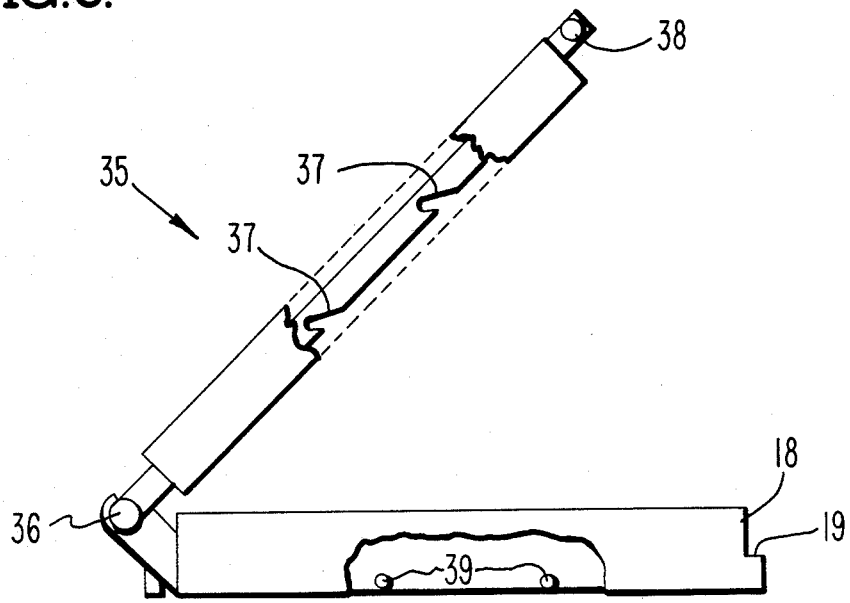
FIG. 6 is a side view (partially broken away) of the test fixture of FIGS. 1-4 illustrating further details of the lockable frame provided as part of the test fixture.

The next step, as illustrated in FIG. 3, is to mechanically depress the probes 10 which are not to be used by providing a mechanical force along the edges of the personalizing board 25, using a lockable frame 35 such as illustrated in FIG. 6 to force the personalizing board 25 against the probes 10 (and also the gasket material 29), thereby causing the blocked ends of the partially drilled holes 28 to depress the unused probes 10. As will be evident from FIG. 6, the lockable frame 35 is pivotable about a pivot 36 on the fixture supporting structure 18 so as to permit it to be manually brought down using a handle 37 to apply force along the edges of the personalizing plate 25 and then be locked in this position as a result of the cooperative action between locking tabs 37 provided on the frame 35 and locking pins 39 provided on the fixture. Note in FIG. 3 that the selected probes 10 in the completely drilled holes 26 remain extended and exposed from the upper end of the personalizing board 25. Also note with respect to FIG. 5 that the personalizing board 25 may be strengthened for depressing the unused probes by providing strengthener bars 29 extending across the board 25.

Figure 4:
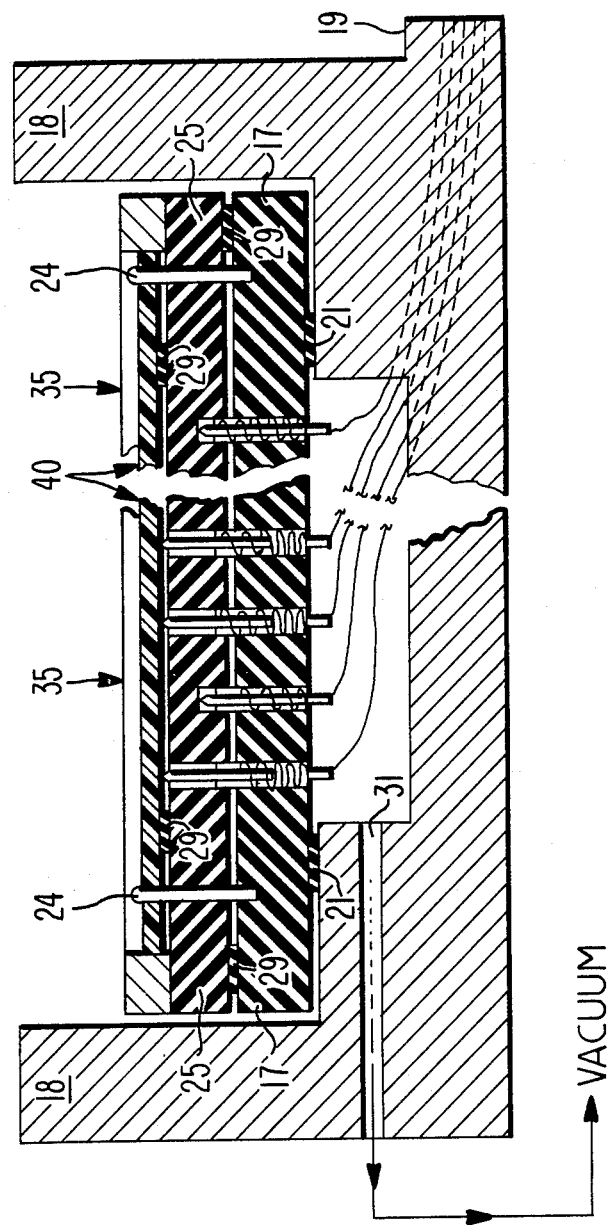

The last steps in using the test fixture, as illustrated in FIG. 4, is to place the circuit board 40 to be tested over the personalizing board 30 using pins 24 for alignment purposes, and then applying a vacuum via the opening 31 in the fixture. It will be understood that, if desired, the circuit board 40 could be placed over the personalizing board 30 prior to depressing the unused probes 10 using the frame 35.

Although the invention has been illustrated with respect to a particular preferred embodiment, it will be understood that many modifications and variations in construction, arrangement and use are possible. Accordingly, the present invention is to be considered as including all such modifications and variations coming within the scope of the appended claims.

What is claimed is:

1. In test apparatus for temporarily making individual electrical contacts to a multiplicity of test points of a circuit board wherein test points may be arranged on the circuit board in a plurality of different possible planar patterns, the combination comprising:

means providing a planar member containing an array of contact probes of sufficient number and arrangement to accommodate said plurality of different possible patterns of test points, each of said probes being resiliently urged in a like predetermined direction perpendicular to said member and extending therefrom;

a plurality of personalizing boards, one for each different type of test point pattern which may be provided for a circuit board to be tested by said apparatus, each personalizing board having a predetermined pattern of holes provided therein corresponding to the test point pattern of the respective circuit board to be tested thereby, each hole being of appropriate size for receiving one of said contact probes;

means providing for the disposing of one side of a personalizing board adjacent and parallel to said array of probes such that the array of holes in the personalizing board are in alignment with and receive corresponding ones of said probes;

means for mechanically forcing a personalizing board against said array of probes so that the probes which are not in alignment with holes in said personalizing board are depressed while the probes received by said holes remain undepressed, the thickness of said personalizing board being chosen relative to the length of said probes so that the undepressed probes are able to extend beyond the other side of the personalizing board after the personalizing board is mechanically forced against said probes;

means providing for the disposing of a circuit board to be tested by said apparatus on a corresponding personalizing board so that its test points are in alignment with the holes provided therein; and vacuum producing means for causing the test points of a circuit board disposed on a personalizing board which has been forced against said array of probes to be forced into electrical contact with the probes extending from the holes in the personalizing board.

2. The invention in accordance with claim 1, wherein each personalizing board also includes partial openings at locations corresponding to probes which are not required for the test point pattern of the respective circuit board to be tested thereby, said partial openings receiving and depressing the non-required probes when a personalized board is mechanically forced against said array of probes.

3. The invention in accordance with claim 1, wherein each of said probes is spring-loaded in said predetermined direction.

4. The invention in accordance with claim 3, wherein a personalizing board includes strengthening means.

5. The invention in accordance with claim 3, wherein sealing means are provided in said fixture for use in conjunction with said vacuum producing means.

6. The invention in accordance with claim 1, 2, 3, 4 or 5, including means for mechanically locking a personalizing board in forced mechanical engagement with said array of probes.

7. The invention in accordance with claim 6, including guide means for use in aligning a personalizing board with said array of probes.

8. The invention in accordance with claim 7, also including guide means for use in aligning a circuit board with a personalizing board.

9. A method for temporarily making individual electrical connections to a multiplicity of test points of a circuit board wherein test points may be arranged on the circuit board in a plurality of different possible patterns of test points, said method comprising:

providing a planar member containing an array of contact probes of sufficient number and arrangement to accommodate said plurality of different possible patterns of test points;

resiliently urging said probes in a like predetermined direction perpendicular to said array so as to extend from said member;

mechanically depressing those probes which are not required for the circuit board to be tested while leaving required probes undepressed;

disposing the circuit board so that its test points are adjacent to and in alignment with the undepressed probes; and applying vacuum in a manner such that said circuit board is forced against the undepressed probes causing them to make electrical contact with their corresponding test points on the circuit board.

* * * * *

UNITED STATES PATENT AND TRADEMARK OFFICE
CERTIFICATE OF CORRECTION

PATENT NO. : 4,496,903

DATED : January 29, 1985

INVENTOR(S) : Ronald A. Paulinski

It is certified that error appears in the above-identified patent and that said Letters Patent is hereby corrected as shown below:

Col. 2, line 6, change "phase" to --pass--.

Signed and Sealed this

Twenty-third Day of July 1985

[SEAL]

Attest:

DONALD J. QUIGG

Attesting Officer

Acting Commissioner of Patents and Trademarks